May 7, 1957 G. C. SZIKLAI 2,791,644

PUSH-PULL AMPLIFIER WITH COMPLEMENTARY TYPE TRANSISTORS

Filed Nov. 7, 1952

INVENTOR.

GEORGE C. SZIKLAI

BY H. L. Olmstead [signature]

ATTORNEY

United States Patent Office
2,791,644
Patented May 7, 1957

2,791,644

PUSH-PULL AMPLIFIER WITH COMPLEMENTARY TYPE TRANSISTORS

George C. Sziklai, Princeton, N. J., assignor to Radio Corporation of America, a corporation of Delaware Application November 7, 1952, Serial No. 319,401
5 Claims. (Cl. 179—171)

*I. Introduction*

This invention relates generally to signal amplifier circuits having two signal paths to provide push-pull operation and particularly to semiconductor signal amplifier circuits of that type.

In the past, electronic discharge devices have been used extensively in circuits having separate signal paths to provide increased power output. This is particularly true in audio frequency amplifier circuits of the "push-pull" type in which increased power output can be obtained with low signal distortion. In a conventional push-pull amplifier one of the amplifier tubes predominately amplifies the positive portion of the signal voltage and does not pass the negative portions as well. The signal, however, is inverted in polarity by the input transformer or phase inverter and applied to the other amplifier tube where what was the negative portions becomes the positive portion and is similarly amplified. The amplified inverted wave is then reinverted and combined with the other amplified wave to reproduce, in amplified form, the original signal. The extent to which the positive portion is amplified in preference to the negative portion in each half of the amplifier determines the class of amplification, commonly called class A, B or C.

The conventional push-pull amplifier circuit utilizing electron discharge devices, however, generally requires (1) a balanced or push-pull driving source to energize the grids of the two amplifier tubes with voltages which are equal in instantaneous amplitude and opposite in instantaneous polarity and (2) means such as a balanced output transformer for combining the amplified, oppositely-phased output currents into a single current suitable for driving the utilization device, such as a loudspeaker.

The balanced driving source may, for example, be a push-pull input transformer having a single primary winding and a center tapped secondary winding. Such a transformer is not only costly but may also give rise to distortion due to phase shift, saturation at low frequencies or resonance effects at high frequencies. Alternatively, the balanced driving source may be an electron-discharge phase-inverter circuit. Phase-inverter circuits, however, are also costly, and the signal may be distorted by reason of the unavoidable variation of circuit elements and tubes or unbalance due to circuit layout.

A balanced output transformer has a center-tapped primary winding and a single secondary winding. The operating characteristics of the overall amplifier circuit are largely determined by the characteristics of the output transformer. Such a transformer is subject to the same disadvantages referred to above in connection with the input transformer. Since the output transformer must pass the full A.-C. and D.-C. components in the anode circuits of the power amplifier tubes its design is even more difficult and its cost is usually many times the cost of the input transformer. The output transformer is usually the most expensive single component of a radio receiver. In the usual push-pull power amplifier circuit, the electron discharge devices and the two halves of the output transformer primary winding are in parallel for the direct current components and in series for the alternating or signal current components. This arrangement gives rise to switching transients which also cause distortion.

This problem of switching transients has been avoided by a circuit published in the "Proceedings of the IRE," January 1952, vol. 40, No. 1, pages 7–11 in an article entitled "A single-ended push-pull audio amplifier," by Peterson and Sinclair. In this circuit the electron discharge devices are arranged in series for the direct currents and in parallel for the alternating currents, thereby avoiding the problem of switching transients. Here again, however, a balanced driving source is required thus necessitating either a phase-inverter circuit or input transformer coupling. For a more complete understanding of the advantages and limitations of conventional push-pull amplifier circuits reference is made to Terman's "Radio Engineering."

The present invention employs semi-conductor devices (such as "transistors") instead of electron-discharge vacuum tubes to overcome the disadvantages of previously known push-pull amplifiers. Semiconductor devices have previously been used in conventional push-pull circuits. This is shown, for example, in an article published in "Electronics," December 1951, page 131, Figure 21, entitled "Transistor circuit design," by Gordon Raisbeck. The circuit illustrated in this article, however, is subject to the same inherent limitations which were discussed above in connection with the conventional push-pull vacuum tube circuits, that is, such a transistor circuit requires a balanced driving source and a balanced output transformer.

Previous attempts to eliminate the costly output transformer, as by coupling a loudspeaker voice coil in a cathode output amplifier circuit, have not been entirely satisfactory because such circuits have caused substantial direct current to flow through the speaker voice coil, or other load device, unless costly blocking capacitors were employed. Furthermore, no voltage gain is obtained in such a circuit.

*II. Objects*

Accordingly, it is an object of this invention to provide a novel push-pull amplifier circuit which operates directly from a single-ended driving source.

A further object of this invention is to provide a novel semi-conductor amplifier circuit capable of being connected directly to an output or load circuit in such manner as not to cause any undesired direct current to flow through the load.

A further object of this invention is to provide a novel push-pull amplifier circuit in which the amplifier devices are energized by signal voltages of the same instantaneous polarity and in which the amplified output current is obtained directly so as to obviate the need for a conventional push-pull input or push-pull output transformer.

It is still a further object of this invention to provide a semi-conductor amplifier circuit which enables push-pull operation without transformer coupling.

Still another object of this invention is to provide a novel semi-conductor amplifier circuit which is capable of being coupled efficiently to a very high output impedance, thereby providing an extremely high voltage gain.

*III. General*

In semi-conductive materials such as germanium or silicon the electrical currents, according to presently accepted theory, are carried by electrons designated as "excess" electrons or by "holes" which are defect or missing electrons. According to the theory, a "hole" may be viewed as a carrier of a positive electric charge and an electron as a carrier of a negative electric charge. Electron or "hole" carriers are designated generically by the term "mobile charges."

A semi-conductive material is called excess or N type when the mobile charges normally present in excess in the material under equilibrium conditions are electrons. N type semi-conductive material passes current easily when the semi-conductive material is negative with respect to a conductive connection thereto.

A semi-conductive material is called defect or P type when the mobile charges normally present in excess in the material under equilibrium conditions are holes. P type semi-conductive material passes current easily when the semi-conductive material is positive with respect to a conductive connection thereto.

Two principal classes of semi-conductor devices have been developed which have been referred to in the art as the "point contact transistor" and the "junction transistor." As the name implies, one form of junction transistor includes a semi-conductive body having alternate zones of N and P type material forming between them junctions or barriers. Electrodes are placed in low-resistance contact with the discrete zones of the material and have been given the names of "collector" electrode, "base" electrode and "emitter" electrode. The collector electrode and the emitter electrode are in contact with the end zones of the semi-conductive body, and the base electrode is in contact with the intervening zone of the semi-conductive body.

The alternate zones of the body of the junction transistor may be in the series N–P–N or in the series P–N–P. In a base-input, grounded emitter circuit, a positive input pulse applied to the base electrode of a P–N–P junction transistor will cause the current flowing from the collector to decrease; whereas, a positive input pulse applied to the base electrode of an N–P–N junction transistor will cause the current flowing into the collector to increase. Thus P–N–P and N–P–N transistors have complementary operating characteristics.

The point contact transistor includes a body of semi-conductive material, which may be N or P type, a base electrode in low resistance contact with the material and two or more closely spaced pointed electrodes in high resistance or rectifying contact with the material. As will appear more fully later, in connection with the discussion of Figure 4, point contact transistors of the P and N types, respectively, have been found to have complementary operating characteristics also, since a positive input applied to the base will produce an increase in the output current in P types, and a decrease in the output current in N types. Thus in the discussion which is to follow semi-conductor amplifiers which have opposite or complementary characteristics, will be referred to as "opposite conductivity types."

*IV. Brief description*

In accordance with a preferred embodiment of the present invention a pair of semi-conductor amplifiers of opposite conductivity type are connected in parallel between the amplifier input and output terminals. That is, corresponding input electrodes of the transistors are connected to the terminals of an input circuit and corresponding output electrodes of the transistors are connected to the terminals of an output circuit. One electrode of each transistor may be common to the input and output circuits and may be connected to the signal current ground. Appropriate bias voltages are applied as described more fully herein. Accordingly, since the characteristics of the transistors of opposite conductivity type are such as to produce an opposite output effect from a given input condition, push-pull amplification is achieved and an amplified single-ended output signal is derived directly from a single-ended input signal.

*V. Figures of the drawing*

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

*VI. Description of Figure 1*

Figures 1, 2, 3, 4:
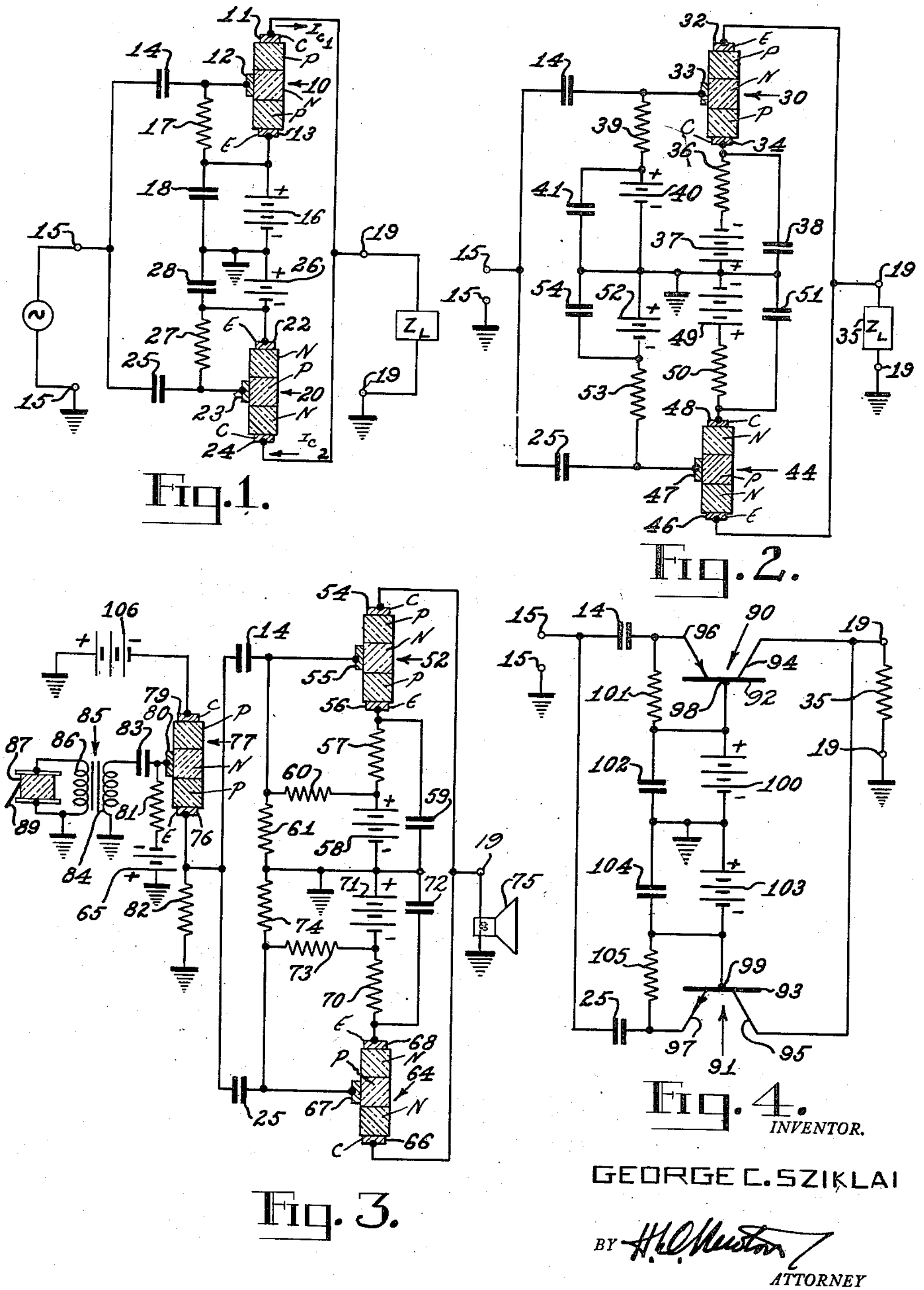
Figure 1 is a schematic diagram of a junction transistor amplifier circuit of the base input, grounded emitter type in accordance with the present invention.
Figure 2 is a schematic circuit diagram of a junction transistor amplifier circuit of the base input, grounded collector type in accordance with the present invention.
Figure 3 is a schematic circuit diagram of a junction transistor amplifier system for record reproduction incorporating a transistor amplifier of the base input, grounded emitter type in accordance with the present invention.
Figure 4 is a schematic circuit diagram of a point contact transistor amplifier circuit of the emitter input, grounded base type in accordance with the present invention.

Referring now to the drawing, in which like reference characters identify like elements in the various figures, Figure 1 illustrates an embodiment of the invention which includes two junction transistors 10 and 20 which are of opposite conductivity types. For example, transistor 10 is of the P–N–P type while transsistor 20 is of the N–P–N type.

Transistor 10 has a collector electrode 11 in contact with one P type zone, a base electrode 12 in contact with the N type zone and an emitter electrode 13 in contact with the other P type zone. An input coupling capacitor 14 is connected between the high voltage terminal of a pair of input terminals 15 and the base electrode 12 which functions as the control electrode. The other input terminal is grounded. A source of operating voltage, such as battery 16, is connected between the emitter electrode 13 and a point of fixed reference potential, such as ground, with its negative terminal grounded. A bias or base resistor 17 is connected between the base electrode 12 and the emitter electrode 13. A signal-frequency bypass capacitor 18 may be connected across battery 16. The collector electrode 11, which functions as the output electrode, is connected directly to one of a pair of output terminals 19. The other of the pair of output terminals 19 is connected directly to ground.

A parallel signal path between the input and output terminals 15 and 19 respectively, similarly includes an N–P–N transistor 20 having a collector electrode 24 in contact with one N type zone, a base electrode 23 in contact with the P type zone and an emitter electrode 22 in contact with the other N type zone. An input coupling capacitor 25 is connected between the high voltage terminal of the pair of input terminals 15 and the base electrode 23. A source of operating voltage, such as battery 26 is connected between the emitter electrode 22 and ground, with its positive terminal grounded. A bias resistor 27 is connected between the base electrode 23 and the emitter electrode 22. A signal-frequency by-pass capacitor 28 may be connected across battery 26. The load or utilization device is indicated generally by the rectangle $Z_L$, which represents, for example, the voice coil of a loud speaker, the input of a subsequent amplifier, or any other device to which amplified signal energy is to be fed. In each case the emitter electrode is common to both the input and output circuits.

Since the collector electrodes 11 and 24 of the two transistors are effectively at D. C. ground potential by reason of the low D. C. impedance of the load device $Z_L$, and since in the static or no signal condition biasing resistors 17 and 27 maintain the base zones of the transistors at the same potential as their respective emitter zones, it will be observed that each collector is biased in the reverse or low conductivity direction. That is, the base N zone of transistor 10 is positive with respect to its collector P zone while the base P zone of transistor 20 is negative with respect to its collector N zone.

*VII. Operation of the embodiment shown in Figure 1*

The output current of transistor 10 will flow from the collector electrode 11 in the direction indicated by the arrow identified by the legend $I_{c1}$. When the "direction" of current flow is referred to herein the conventional concept that current flows from a point of positive polarity to a point of less positive polarity is implied. A positive signal voltage applied from the input terminals between the base electrode 12 and the emitter electrode 13 drives the potential of the base electrode in the positive direction with respect to the emitter electrode. Since the transistor 10 is of the P–N–P variety, this will reduce the amplitude of the collector electrode current $I_{c1}$. Similarly, a negative signal pulse will tend to increase current $I_{c1}$. The collector electrode current can be considered to flow from battery 16, into the emitter electrode 13, out of the collector electrode, and through the load impedance $Z_L$ back to the negative terminal of battery 16.

Since the second transistor 20 is of the N–P–N variety or opposite conductivity type, the output or collector electrode current, which is designated by the arrow identified by the legend $I_{c2}$, flows, in this case, into the collector electrode 24 and will increase in amplitude when the base electrode 23 is driven by the signal voltage in a positive direction with respect to the emitter electrode 22. The collector electrode current $I_{c2}$ can be considered to flow from ground (the positive terminal of battery 26), through the load impedance $Z_L$, into the collector electrode 24 and out of the emitter electrode 22 back to the battery 26. The output currents $I_{c1}$ and $I_{c2}$, therefore, flow in opposite directions through the output load impedance $Z_L$.

It can now be seen that in a static or no-signal condition, assuming the characteristics of the transistor 10 are numerically identical but complementary to the characteristics of the transistor 20, the net D. C. current through the output load impedance $Z_L$ will be zero.

If an alternating input signal voltage is now applied between the input terminals 15, each of the base electrodes 12 and 23 will be driven instantaneously and equally in the same direction, i. e. polarity, relative to ground. However, the input signal will produce opposite effects on the collector electrode currents flowing in the two transistors. Thus, as the collector current $I_{c1}$ flowing in one direction through the load decreases in amplitude the collector current $I_{c2}$ flowing in the opposite direction through the load increases in amplitude, and vice versa. The effective output current through the load is therefore, the differential current and is an alternating current corresponding to the applied input voltage.

In a practical circuit which was built according to the schematic circuit diagram of Figure 1, using RCA Type 2N34 (P–N–P) and 2N35 (N–P–N) transistors, the batteries 16 and 26 were each 22.5 volts and the bias resistors 17 and 27 each had a resistance of 100,000 ohms. The output load impedance was approximately 2,200 ohms. It will be understood, however, that the voltages supplied by batteries 16 and 26 will be chosen with a knowledge of the requirements of the particular transistor used and the current or voltage output desired from the amplifier.

The push-pull transistor amplifiers of the present invention may be operated as class A, B or C amplifiers by a suitable selection of the circuit parameters in a manner analogous to the operation of vacuum tube amplifiers. While the actual values chosen depend on the characteristics of the particular type of transistor employed, just as the voltages applied to a vacuum tube depend upon its type, in general the class of operation is expressed in terms of the amplifier performance and the values are chosen to produce the performance desired. The circuit illustrated in Figure 1 and operated as described above, will provide class B operation.

The circuit of Fig. 1 may also be operated class A or class C by suitably biasing the base electrodes 12 and 23 relative to emitter electrodes 13 and 22 respectively. For class A operation the base electrode 12 of the P–N–P transistor would be biased negatively by about 0.1 to 0.8 volt with respect to the emitter 13 and the base 23 of the N–P–N transistor would be biased an equal amount positively with respect to its emitter 22, these bias voltages being in the forward direction in each case. Since during class A operation a small current will flow through each bias resistor, the voltage drop across the bias resistor must be taken into consideration. Thus where battery bias is employed the actual battery voltage must exceed the desired bias voltage by an amount equal to the voltage drop across the bias resistor. For class C operation the base electrode 12 of the P–N–P transistor would be biased to "cut-off" or below by applying bias voltages of from 0.1 to 10.0 volts positive with respect to the emitter 13. The base electrode 12 of the N–P–N transistor would be biased a corresponding amount negative with respect to its emitter 22, these bias voltages being in the reverse direction in each case.

Bias voltages may be obtained by inserting appropriately poled batteries in the base-emitter circuit, by returning the base or emitter leads to a suitable tap on the batteries 16 and 26 or in the manner to be described later in connection with Figure 3. The actual value of the class C bias depends upon the amplitude of the input signal and the degree of cut-off desired. All the bias voltages also depend upon the operating characteristics of the transistors employed. Bias voltages may readily be adjusted to the desired value by observing the wave shape of a test voltage with a cathode ray oscilloscope, in the conventional manner.

In class A operation the base electrode of the P–N–P transistor is made slightly negative and the base electrode of the N–P–N transistor is made slightly positive relatively to their emitters, as a result of which both transistors are conducting in the absence of signal input. Consequently, a small current flows around the loop formed by the two batteries and the two transistors in series. In the steady state condition the two transistors can be considered as two equal resistances. It will be observed, therefore, that the output terminal 19, to which the collector electrodes are connected, is at ground potential. Consequently, no output voltage is impressed on and no current flows through the load impedance.

When a signal voltage is applied, the maximum amplitude of which is not sufficient to cut-off either transistor, as in the usual concept of class A operation, it is as though one resistance increased in value while the other one decreased a like amount. A varying signal voltage will therefore swing the potential at the high voltage output terminal 19 from a value approaching the positive potential of battery 16 to a value approaching the negative potential of battery 26. This effect will occur even when the load impedance $Z_L$ is disconnected from the circuit. Thus voltage amplification occurs even with a load of infinite impedance. The operating voltage for each transistor is thus obtained by a circuit path through the other. Each one may therefore be considered to constitute D. C. load for the other.

As a result of this characteristic of the circuit shown, during substantial Class A operation the amplifier output voltage does not depend on the presence of the load impedance $Z_L$ and the amplifier circuit may therefore be used as a voltage amplifier to deliver an amplified voltage into an infinitely high load impedance. The amplifier output may be connected directly to the grid electrode of a vacuum tube, for example, and no shunt grid-leak resistor will be required since there is a D. C. ground return path for the grid through the transistor circuit. This unique effect finds no counterpart in any known circuits employing conventional vacuum tubes. Capacity coupling to a load may, of course, also be employed.

In the embodiment of the invention illustrated in Figure 1, maximum emitter-collector output current flows through the P–N–P transistor 10 when the base electrode 12 is made negative by the signal with respect to the emitter electrode 13, i. e., when the grounded emitter electrode 13 becomes positive with respect to the base electrode. Maximum collector-emitter output current flows through the N–P–N transistor 20 when the base electrode is made positive with respect to emitter electrode 22, i. e., when grounded emitter electrode 22 becomes negative with respect to the base electrode 23. The emitter electrode of a transistor may, therefore, be defined as the electrode which must be made positive with respect to the base electrode to enable output current to flow in a P–N–P transistor or negative with respect to the base electrode to enable output current to flow in an N–P–N transistor.

*VIII. Description of Figure 2*

Referring now to Figure 2 there is shown a schematic of an alternative form of this invention employing a base input, emitter output transistor amplifier as distinguished from the base input, collector output circuit illustrated in Figure 1.

In the discussion of Figure 1 the requirements for and methods of obtaining class C operation were briefly discussed. In order to illustrate one such method it will also be assumed that class C operation is desired in the embodiment of the invention illustrated in Figure 2. This biasing arrangement may also be employed for class C operation of the collector-output circuit of Figure 1 provided the bias and operating potentials are properly selected. The emitter-output circuit of Figure 2 may also be operated class B, as in Figure 1, or class A, by selecting the bias voltages in the manner described above.

A first P–N–P type junction transistor 30 includes a semi-conductive body having alternate P–N–P zones of opposite conductivity material, an emitter electrode 32, a base electrode 33 and a collector electrode 34, each in contact with one of the zones of the semi-conductive body. As in Figure 1, a coupling capacitor 14 is connected between the base electrode 33, which functions as the control electrode, and the high voltage one of a pair of input terminals 15 the other of which is connected to ground. The emitter electrode 32 now functions as the output electrode and is connected to one of a pair of output terminals 19 across which the output load impedance $Z_L$ may be connected. A current limiting resistor 36 of approximately 1,000 ohms and an energizing battery 37 are connected in series between the collector electrode 34 and ground and are bypassed at signal frequencies by a bypass capacitor 38 so that the collector electrode is grounded for signal frequencies and is therefore common to the input and output circuits. The positive terminal of battery 37 is grounded. Biasing resistor 39 and bias battery 40 are connected in series between the base electrode 33 and ground, the negative terminal of the bias battery being grounded. A bypass capacitor 41 may be connected in shunt with the battery 40.

The second parallel signal channel includes a second transistor 44 comprising a semiconductive body having alternate N–P–N zones of opposite conductivity material and having an emitter electrode 46, a base electrode 47 and a collector electrode 48 each in low-resistance or ohmic contact with their respective zones of the semiconductive body. A coupling capacitor 25 is connected between the high voltage one of the pair of input terminals 15 and the base electrode 47. Operating potential for the emitter electrode-collector electrode circuit is provided by means of a battery 49 and a current limiting resistor 50 of approximately 1,000 ohms connected in series between the collector electrode 48 and ground. The negative terminal of battery 49 is grounded. The battery and resistor are effectively shunted at signal frequencies by a bypass capacitor 51. Bias voltage for the base electrode 47 is provided by means of a bias battery 52, having its positive terminal grounded, and a bias resistor 53, which are connected in series between the base electrode 47 and ground. A bypass capacitor 54 may be connected in shunt with the bias battery 52.

*IX. Operation of Figure 2*

The operation of the transistor amplifier shown in Figure 2 is the same as that shown in Figure 1 so far as the fundamental performance is concerned. Thus each circuit provides push-pull amplification directly from a common, single-ended input signal and directly provides single-ended output to the load without using phase inverters or push-pull input or output transformers. In each case no direct current flows through the load impedance. In each case the operation involves the combination of alternating output currents flowing through the load device in opposite directions into one and from the other transistor. In each case the transistors are of opposite conductivity types and operate to control their output currents oppositely when affected identically by the input voltage. There are, however, certain differences that may be used to advantage.

The first difference is that arising from the choice of class B operation to illustrate the amplifier of Figure 1 and class C in Figure 2. This does not constitute an essential difference, however, since either amplifier may be operated as class A, B, or C, as desired, by selecting appropriate operating parameters, as described above.

One operational difference is that the emitter output circuit of Figure 2 is essentially a current amplifier whereas the collector output circuit of Figure 1 may be operated either as a current amplifier or as a high-gain voltage amplifier. As a consequence the impedance looking into the output circuit of the emitter output amplifier is low, so that this amplifier will transfer energy efficiently into a load having an A. C. impedance of the order of 100 ohms. This makes it particularly suitable for driving a loudspeaker voice coil, for example.

By reason of class C operation substantially no steady state current flows through the transistors 30 and 44. However, when a negative input signal is applied to the base electrode 33 of the P–N–P transistor which is of sufficient amplitude to overcome the positive bias provided by bias battery 40, a greatly amplified current will flow through the load device $Z_L$ and into the emitter electrode 32. No current flows into the load from transistor 44 at this time. However, when the polarity of the input signal reverses and a positive potential is applied to base electrode 47 of the N–P–N transistor an amplified output current will flow from its emitter electrode 46 into the load $Z_L$. Thus the alternating signal wave appears in amplified form, in the load impedance.

It will be apparent that separate bias batteries 40 and 52 will not be required if the leads from the bias resistors are connected to taps of equivalent voltage on batteries 37 and 49 so long as the proper polarities with respect to ground are obtained. Resistance voltage dividers, as shown in Figure 3, may also be used.

*X. Description of Figure 3*

Figure 3 illustrates a practical transistor phonograph record amplifier system in accordance with this invention. The push-pull output stage includes a first P–N–P transistor 52 having alternate zones of opposite conductivity material, a collector electrode 54, a base electrode 55 and an emitter electrode 56, each in contact with one of the zones of the semi-conductive body 52.

A current limiting resistor 57 and a battery 58 are connected in series arrangement between the emitter electrode 56 and ground and are bypassed at signal frequencies by a bypass capacitor 59 connected in shunt therewith so that the emitter is common to the input and output circuits, as in Figure 1. Bias for the base electrode-emitter electrode circuit is provided by voltage divider network comprising a pair of voltage dividing resistors 60 and 61 connected in series across battery 58. The base electrode 55, which functions as the input electrode, is directly connected to the junction of the voltage dividing resistors 60 and 61 and is, therefore, at a potential which is less positive, with respect to ground, than the potential of the emitter electrode.

The voltage which is provided by the biasing network may be such as to provide a bias voltage of the order of 0.2 volt between the base electrode 55 and the emitter electrode 56 in the forward direction, i. e., positive on a P–zone and negative on an N–zone, thereby providing class A operation of the transistor 52. With this type of bias the transistor device will be more or less responsive to input signal voltages throughout the entire cycle providing the voltages are not in excess of the applied bias voltage.

The second transistor 64 is of the N–P–N type and includes alternate zones of opposite conductivity material. As before there is a collector electrode 66, a base electrode 67 and an emitter electrode 68 in contact with the three zones of the semi-conductive body. The circuit for the N–P–N transistor is the same as that described in connection with the P–N–P transistor. Current limiting resistor 70 and a battery 71 are connected in series between the emitter electrode 68 and ground and may be shunted by a bypass capacitor 72. Biasing voltage for the base electrode-emitter electrode circuit is provided by means of a pair of voltage divider resistors 73 and 74 which are connected in series across battery 71. The net bias voltage applied to the base of the N–P–N transistor should be the same as that applied to the base of the P–N–P transistor. The base electrode 67 is directly connected to the junction of the biasing voltage divider resistors 73 and 74. The battery 71 is polarized oppositely to battery 58, with respect to ground.

The collector electrodes 54 and 66 of the two transistors function as the output electrodes and are connected to one terminal of a pair of output terminals 19 across which is connected the voice coil of a loudspeaker 75 which may have an impedance of the order of 500 ohms. The base electrodes 55 and 67 are connected by coupling capacitors 14 and 25, respectively, to the emitter electrode 76 of a transistor 77, thereby providing a common signal input source for the two push-pull amplifier transistors 52 and 64.

Transistor 77 is a P–N–P junction transistor preamplifier. A biasing resistor 81 is connected between its base electrode 80 and the negative terminal of a bias battery 65, the positive terminal of which is grounded.

The collector electrode 79 is connected to the negative terminal of battery 106. A load resistor 82 is connected between the emitter electrode 76 and ground. It is across this load resistor 82 that the signal voltage will be developed which is applied to the push-pull transistor amplifier circuit. A coupling capacitor 83 is connected between the base electrode 80 and one terminal of the secondary winding 84 of a coupling transformer 85. The other terminal of the secondary winding 84 is connected to ground. The primary winding 86 of the coupling transformer 85 is connected to a crystal cartridge 87 having a stylus 89 which is responsive to the grooves in a phonograph record. For best operation it is desirable that one terminal of the primary winding 86 be connected directly to ground. Coupling transformer 85 functions as an impedance matching device to match the high impedance of the crystal cartridge 87 to the relatively low input impedance of the preamplifier transistor 77. If a magnetic or reluctance type of phonograph cartridge were utilized, such an impedance transformation would not be required.

It is to be understood that the input signal source for the push-pull transistor amplifier above described may be a single transistor pre-amplifier, as shown in Figure 3, or any other convenient source of signal energy such as an amplifier utilizing an electron discharge device. While separate batteries have been shown in order to simplify the circuit diagram it will be understood that a common battery, with appropriate taps, or a resistance bleeder may be employed to provide all bias and operating potentials.

*XI. Operation of the system illustrated in Figure 3*

Signal voltages which are produced by the crystal cartridge 87 will be applied between the base electrode and the emitter electrode of the pre-amplifier transistor 77, thereby causing a variation in the emitter-collector current flowing through the emitter load resistor 82. These current variations will, of course, produce voltage variations across the emitter load resistor 82, which will in turn be impressed simultaneously between the base electrodes 55 and 67 and their respective emitter electrodes 56 and 68.

As above discussed, the transistors 52 and 64 are of opposite conductivity type, that is, the transistor 52 is of the P–N–P variety whereas the transistor 64 is of the N–P–N variety and accordingly the applied signal voltage will cause the collector electrode currents of the transistors 52 and 64, flowing in opposite directions through the voice coil, to change in opposite directions, thereby producing a differential current through the voice coil of the loaudspeaker device 75 which differential current will represent an amplified duplicate of the input signal voltage.

In a practical device embodying the form of invention illustrated in Figure 3 using RCA type 2N34 (p–n–p) and 2N35 (n–p–n) transistors the following circuit constants were employed. Batteries 58 and 71 were 22½ volts. In the bias network resistors 60 and 73 were 9100 ohms, while resistors 61 and 74 were 24,000 ohms. The limiting resistors 57 and 70 were 910 ohms. The voice coil impedance was 500 ohms. Power output of 120 milliwatts at 2% distortion was obtained.

It should be noted that in class A operation the output current will produce a voltage drop across the current limiting resistors which must be taken into account in determining the potential at the junction of the two bias resistor networks. The effective emitter-base bias voltage will be determined, however, in accordance with the class of operation desired, as discussed above.

The operation of the push-pull amplifier illustrated in Figure 3 is basically the same as that discussed in connection with the embodiment of Figure 1, and similar advantages are obtained. The operation of the pre-amplifier portion, per se, involving transistor 77, is conventional and need not be discussed further.

*XII. Description of Figure 4*

Figure 4 illustrates a transistor amplifier in accordance with the present invention utilizing point contact transistors. Inasmuch as Figures 1, 2 and 3 utilize junction transistors, before describing the specific circuitry and the operation of this amplifier it will be well first to discuss some of the characteristics of point contact transistors.

The point contact transistor comprises a semi-conductive body having a pair of pointed electrodes in high-resistance or rectifying contact with the semi-conductive body and a third electrode in low-resistance or ohmic contact with the semi-conductive body. These electrodes are also referred to as the emitter electrode, the collector electrode and the base electrode. The emitter electrode and the collector electrode are each in high-resistance or rectifying contact with the semi-conductive body whereas the base electrode is in low-resistance or ohmic contact with the semiconductive body.

The semi-conductive body may be of either N type or P type material. The term "opposite conductivity type" as applied above to junction transistors will also apply to point contact transistors and refers to transistors having a semi-conductive body of N type material in contrast to other transistors having a semi-conductive body of P type material. It is noted at this time that an N type point contact transistor is of the same conductivity type as a P–N–P junction transistor and that a P type point contact transistor is of the same conductivity type as an N–P–N junction transistor.

It is to be understood that the present invention can utilize either junction or point contact transistors. When utilizing point contact transistors, at least in the present state of the art, it is preferred that the arrangement employ the emitter input, grounded base circuit. This is due to the fact that point contact transistors tend to be unstable when there is any appreciable impedance in the base circuit, as is well known.

The transistor amplifier illustrated in Figure 4 comprises a pair of point contact transistors 90 and 91 of N and P types, respectively, having semi-conductive bodies 92 and 93, collector electrodes 94 and 95 in rectifying or high resistance contact with the respective semi-conductive bodies which function as the output electrodes, emitter electrodes 96 and 97 also in high-resistance or rectifying contact with the respective semi-conductive bodies which function as the input electrodes, and base electrodes 98 and 99 in low-resistance or ohmic contact with the respective semi-conductive bodies and which are common to the input and output circuits. Input coupling capacitors 14 and 25 are connected between the emitter electrodes 96 and 97, respectively, and one of a pair of input terminals 15.

Operating voltage is provided for the N type transistor 90 by a battery 100 which is connected between the base electrode 98 and ground. The battery is poled with its negative terminal grounded so as to provide a reverse bias between the base electrode 98 and the collector electrode 94. An emitter bias resistor 101 is connected between the emitter electrode 96 and the base electrode 98, providing class B operation. A bypass capacitor 102 may be connected in shunt with the battery 100.

The circuit for the P type transistor 91 is identical to that described above for the N-type transistor except that the positive terminal of its battery 103 is poled with its positive terminal grounded so as to apply a reverse bias between the collector electrode 95 and the base electrode 99. An emitter resistor 105 is connected between the emitter electrode 97 and the base electrode 99. A bypass capacitor 104 may be connected in shunt with the battery 103.

The collector electrodes 94 and 95 are each connected to one of a pair of output terminals 19 across which is connected an output load impedance represented as a resistor 35.

*XIII. Operation of the amplifier illustrated in Figure 4*

The operation of the point contact transistor amplifier circuit above described is analogous to the operation of the junction type transistor amplifier circuit of Figure 1. Due to the complementary symmetry of operating characteristics of an N type point contact transistor and a P type point contact transistor, a common signal voltage which is applied simultaneously between the emitter electrodes 96 and 97 and their respective base electrodes 98 and 99 will cause the collector electrode currents to vary in an opposite sense, that is, the currents through the respective transistors will flow in opposite directions through the load and one will be increased at the same time that another will be decreased in response to a given input voltage. A differential current will therefore flow through the load resistor 35 producing across the load resistor 35 a signal voltage which is an amplified duplicate of the input signal.

The point contact amplifier illustrated in Figure 4 may be operated as a class C amplifier by providing an appropriate negative bias for the emitter electrode 96 of the N type transistor and a positive bias for the emitter electrode 97 of the P type transistor. Class A operation may be obtained by reversing each of these bias polarities.

As in the embodiments of this invention discussed above, no current will flow in the load when the circuit is in a static condition and the average current drain from each battery will, therefore, be very low. When operated Class A this amplifier circuit is also capable of working into an infinite direct current impedance. Accordingly, the amplifier circuits provided by the present invention can be utilized to drive the electrostatic deflection plates of a kinescope even though these plates present only capacitive load to the output terminals 19.

One of the advantages obtained by the circuit arrangements embodying the present invention is the efficiency which is obtained, particularly when the output load is of high impedance. This efficiency is due to the fact that the direct currents which are necessary to provide operation of the devices do not flow through the output load as in conventional circuit arrangements.

It is to be understood that the transistor amplifier provided by this invention can assume various series and parallel arrangements all of which will fall within the scope of this invention.

It will be appreciated that while this invention has been described by reference to point contact and junction transistors that it is in no way limited to transistors of these specific forms. Other types which have operating characteristics which are complementary and symmetrical in the N and P forms may also be used in the practice of this invention even though they may differ in the detailed manner by which the output currents are controlled by the input voltages.

It can thus be seen that the present invention provides a transistor amplifier circuit which is capable of amplifying, by a push-pull operation, a single-ended input signal voltage to produce directly an amplified single ended output signal voltage or current. Furthermore, no direct current flows through the output load circuit and there is no requirement for an input transformer, a phase inverter circuit, a balanced output transformer or a floating source of operating potential such as is sometimes required with conventional push-pull circuits.

What is claimed is:

1. In a push-pull signal amplifier circuit the combination comprising, a first transistor of one conductivity type including a first input, a first common, and a first output electrode, a second transistor of an opposite conductivity type including a second input, a second common, and a second output electrode, input circuit means connected with said first and second input electrodes for simultaneously applying input signal energy of the same instantaneous polarity between each of said input electrodes and their respective common electrodes, means providing a first direct-current supply source connected between said first common electrode and ground, means providing a second direct-current supply source connected between said second common electrode and ground, and means providing a load impedance element for said circuit connected with each of said output electrodes and to ground, said transistors being alternately responsive to input signals of opposite polarity to provide current flow through said load impedance element in one direction when said first transistor is conductive and current flow through said load impedance element in an opposite direction when said second transistor is conductive.

2. In a push-pull signal amplifier circuit the combination comprising, a first transistor of one conductivity type including a first base, a first emitter, and a first collector electrode, a second transistor of an opposite conductivity type including a second base, a second emitter, and a second collector electrode, input circuit means connected with said first and second base electrodes for simultaneously applying input signal energy of the same instantaneous polarity between each of said base electrodes and their respective emitter electrodes, means providing a first direct-current supply source connected between said first emitter electrode and ground, means providing a second direct-current supply source connected between said second emitter electrode and ground, and means providing a load impedance element for said circuit connected with each of said collector electrodes and to ground, said transistors being alternately responsive to input signals of opposite polarity to provide current flow through said load impedance element in one direction when said first transistor is conductive and current flow through said load impedance element in an opposite direction when said second transistor is conductive.

3. In a push-pull signal amplifier circuit the combination comprising, a first transistor of one conductivity type including a first base, a first collector, and a first emitter electrode, a second transistor of an opposite conductivity type including a second base, a second collector, and a second emitter electrode, input circuit means connected with said first and second base electrodes for simultaneously applying input signal energy of the same instantaneous polarity between each of said base electrodes and their respective collector electrodes, means providing a first direct-current supply source connected between said first collector electrode and ground, means providing a second direct-current supply source connected between said second collector electrode and ground, and means providing a load impedance element for said circuit connected with each of said emitter electrodes and to ground, said transistors being alternately responsive to input signals of opposite polarity to provide current flow through said load impedance element in one direction when said first transistor is conductive and current flow through said load impedance element in an opposite direction when said second transistor is conductive.

4. In a push-pull signal amplifier circuit the combination comprising, a first transistor of one conductivity type including a first emitter, a first base, and a first collector electrode, a second transistor of an opposite conductivity type including a second emitter, a second base, and a second collector electrode, input circuit means connected with said first and second emitter electrodes for simultaneously applying input signal energy of the same instantaneous polarity between each of said emitter electrodes and then respective base electrodes, means providing a first direct-current supply source connected between said first base electrode and ground, means providing a second direct-current supply source connected between said second base electrode and ground, and means providing a load impedance element for said circuit connected with each of said collector electrodes and to ground, said transistors being alternately responsive to input signals of opposite polarity to provide current flow through said load impedance element in one direction when said first transistor is conductive and current flow through said load impedance element in an opposite direction when said second transistor is conductive.

5. In a push-pull signal amplifier circuit the combination comprising, a first transistor of one conductivity type including a first input, a first common, and a first output electrode, a second transistor of an opposite conductivity type including a second input, a second common, and a second output electrode, input circuit means connected with said first and second input electrodes for simultaneously applying input signal energy of the same instantaneous polarity between each of said input electrodes and their respective common electrodes, means providing a first direct-current supply source connected between said first common electrode and ground, means providing a second direct-current supply source connected between said second common electrode and ground, means providing a first direct-current conductive path between said first input and first common electrodes, means providing a second direct-current conductive path between said second input and second common electrodes, said first and second paths being independent of each other, and means providing a load impedance element for said circuit connected with each of said output electrodes and to ground, said transistors being alternately responsive to input signals of opposite polarity to provide current flow through said load impedance element in one direction when said first transistor is conductive and current flow through said load impedance element in an opposite direction when said second transistor is conductive.

References Cited in the file of this patent

UNITED STATES PATENTS

| | | |
|---|---|---|
| 2,370,221 | Barney | Feb. 27, 1945 |
| 2,517,960 | Barney et al. | Aug. 8, 1950 |
| 2,569,347 | Shockley | Sept. 25, 1951 |
| 2,666,818 | Shockley | Jan. 19, 1954 |
| 2,666,819 | Raisbeck | Jan. 19, 1954 |

OTHER REFERENCES

Bell text "The Transistor," pp. 362, 370–372, pub. 1951 by Bell Tel. Lab's, Inc.